United States Patent [19]

Reyner

[11] Patent Number: 5,267,248

[45] Date of Patent: Nov. 30, 1993

[54] METHOD AND APPARATUS FOR SELECTING AN OPTIMUM ERROR CORRECTION ROUTINE

[75] Inventor: Noel L. Reyner, Hilton, N.Y.

[73] Assignee: Eastman Kodak Company, Rochester, N.Y.

[21] Appl. No.: 633,136

[22] Filed: Dec. 24, 1990

[51] Int. Cl.⁵ ............................................. G01R 31/28
[52] U.S. Cl. ...................................... 371/25.1; 371/30; 371/37.1
[58] Field of Search ................... 371/25.1, 30, 37.1, 371/40.1–40.4

[56] References Cited

U.S. PATENT DOCUMENTS

| | | | |
|---|---|---|---|
| 4,408,326 | 10/1983 | Takeuchi et al. | 371/40.3 |
| 4,475,131 | 10/1984 | Nishizawa et al. | 358/335 |
| 4,541,010 | 9/1985 | Alston | 358/44 |
| 4,691,253 | 9/1987 | Silver | 360/33.1 |
| 4,733,396 | 3/1988 | Baldwin et al. | 371/40.2 |
| 4,782,490 | 11/1988 | Tenengolts | 371/40 |
| 4,949,342 | 8/1990 | Shimbo et al. | 371/40.1 |
| 4,998,252 | 3/1991 | Suzuki et al. | 371/40.1 |

FOREIGN PATENT DOCUMENTS 0188271 1/1986 European Pat. Off. .

OTHER PUBLICATIONS

Patent Abstracts of Japan, vol. 10, No. 35 (E-380) 12 Feb. 1986 & JP, A, 60192478 (Pioneer K.K.) 30 Sep. 1985, see abstract.

Patent Abstracts of Japan, vol. 6, No. 259 (E-149) 17 Dec. 1982 & JP, A, 57155856 (Fujitsu K.K.) 27 Sep. 1982, see abstract.

*Primary Examiner*—Hoa T. Nguyen
*Attorney, Agent, or Firm*—Parkhurst, Wendel & Rossi

[57] ABSTRACT

A method and apparatus for performing error correction is disclosed in which an optimum error correction algorithm to be applied to a digital data signal is selected based on a detected characteristic of the digital data signal. The selection of an optimum error correction algorithm based on a characteristic of the digital data signal insures maximum efficiency of the error correction process with a minimum impact on overall system throughput efficiency.

3 Claims, 1 Drawing Sheet

METHOD AND APPARATUS FOR SELECTING AN OPTIMUM ERROR CORRECTION ROUTINE

TECHNICAL FIELD

The invention is generally related to providing error correction of digital data signal In particular, the invention provides a method and apparatus for selecting an error correction routine that is to be applied to a digital data signal based on a detected characteristic of the digital data signal.

BACKGROUND ART

It is often the case that portions of a transmitted or recorded digital data signal cannot be recovered due to problems encountered during the transmission, reception or reproduction of the digital data signal For example, in the case of magnetically recorded data, digital data that is recorded on a storage disk of a disk drive unit in some cases cannot be reproduced due to problems encountered during the recording process, defects in the storage disk, or malfunctions in the circuitry of the disk drive unit. The loss of portions of a digital data signal is particularly critical in cases where the digital data signal represents a compressed data set of a larger original data set.

Data compression is utilized in many applications where the original data set contains redundant information. It is desirable to reduce the amount of redundant information prior to storing the data, for example, in order to reduce the amount of memory capacity required to store the data. Data compression is commonly used in electronic imaging systems to reduce the amount of memory or storage space required to store digital image data. Electronic imaging systems generally capture an image as a plurality of data points or image pixels. Many images, however, have large sections, such as a blue sky or green grass, that contain identical image information. In such cases, image compression algorithms are utilized to select representative image pixels for the entire image section. Decompression algorithms can then reproduce the entire image section from the representative image pixels. Thus, the amount of memory space required to store a representation of the image can be reduced, as only the representative image pixels need to be stored.

While the above-described data compression provides the advantage of reducing the amount of memory space required, the implementation of data compression techniques requires that the data reproduction process perform with a high degree of reliability in reproducing the compressed data, as each bit of compressed data actually represents a number of original data points. For example, while the loss of number of individual image pixels would not result in a serious degradation of a reproduced image, the loss of the representative image pixels would result in serious image degradation as whole blocks or segments of the image could not be successfully reproduced. Accordingly, error correction must be provided to correct errors that occur during the reproduction process.

The concept of providing error correction to correct errors that occur during the reproduction of a recorded data signal is of course well known. U.S. Pat. No. 4,691,253 issued to Silver on Sep. 1, 1987, for example, discloses an electronic imaging camera for recording either moving or still images which incorporates a digital processing circuit that provides error correction to correct drop outs, noise spikes, etc., that may result during the reproduction of data from a flawed magnetic storage medium. Performing complex error correction routines for highly corrupted recordings can be time consuming, however, resulting in a degradation of the throughput efficiency of the imaging system as a whole. Less sophisticated methods of error correction can be utilized only with a corresponding tradeoff in image quality. Thus, the selection of an appropriate error correction routine has conventionally been a tradeoff between providing acceptable image quality with a reasonable throughput efficiency over a wide range of data reproduction conditions.

In view of the above, it would be desirable to provide a method and apparatus for performing error correction that could minimize overall system throughput time without a resulting loss in quality of the reproduced data. It is therefore an object of the invention to provide a method and apparatus for performing error correction that selects an optimum error correction routine that is to be applied to a digital data signal based on a detected characteristic of the digital data signal.

SUMMARY OF THE INVENTION

The invention provides a method and apparatus for performing error correction in which an optimum error correction routine to be applied to a digital data signal is selected based on a detected characteristic of the digital data signal. The selection of an optimum error correction routine based on a characteristic of the digital data signal insures maximum efficiency of the error correction process with a minimum impact on overall system throughput efficiency.

More specifically, the invention provides an apparatus for providing error correction of a digital data signal that includes a mechanism for generating a digital data signal; a detection unit for detecting an error characteristic of the digital data signal and generating a detection signal indicative thereof; and a processing unit for performing an error correction routine on the digital data signal based on the detection signal generated by the detection unit.

The processing unit performs the error correction routine by implementing an optimum error correction algorithm. The processing unit selects the optimum error correction algorithm from a plurality of error correction algorithms that are stored in a memory unit in response to the detection signal generated by the detection unit. Alternatively, a single multi-level error correction algorithm is stored and the processing unit selects the number of levels of error correction to be performed based on the detection signal. The detection unit preferably generates the detection signal based on the drop out rate of the digital data signal being process, although other error characteristics may also be employed.

BRIEF DESCRIPTION OF THE DRAWINGS

With the above as background, reference should now be made to the following detailed description of the preferred embodiment and the accompanying drawing, which illustrates a block diagram of an electronic camcorder that incorporates the invention.

DETAILED DESCRIPTION OF THE PREFERRED EMBODIMENTS

Figure 1:
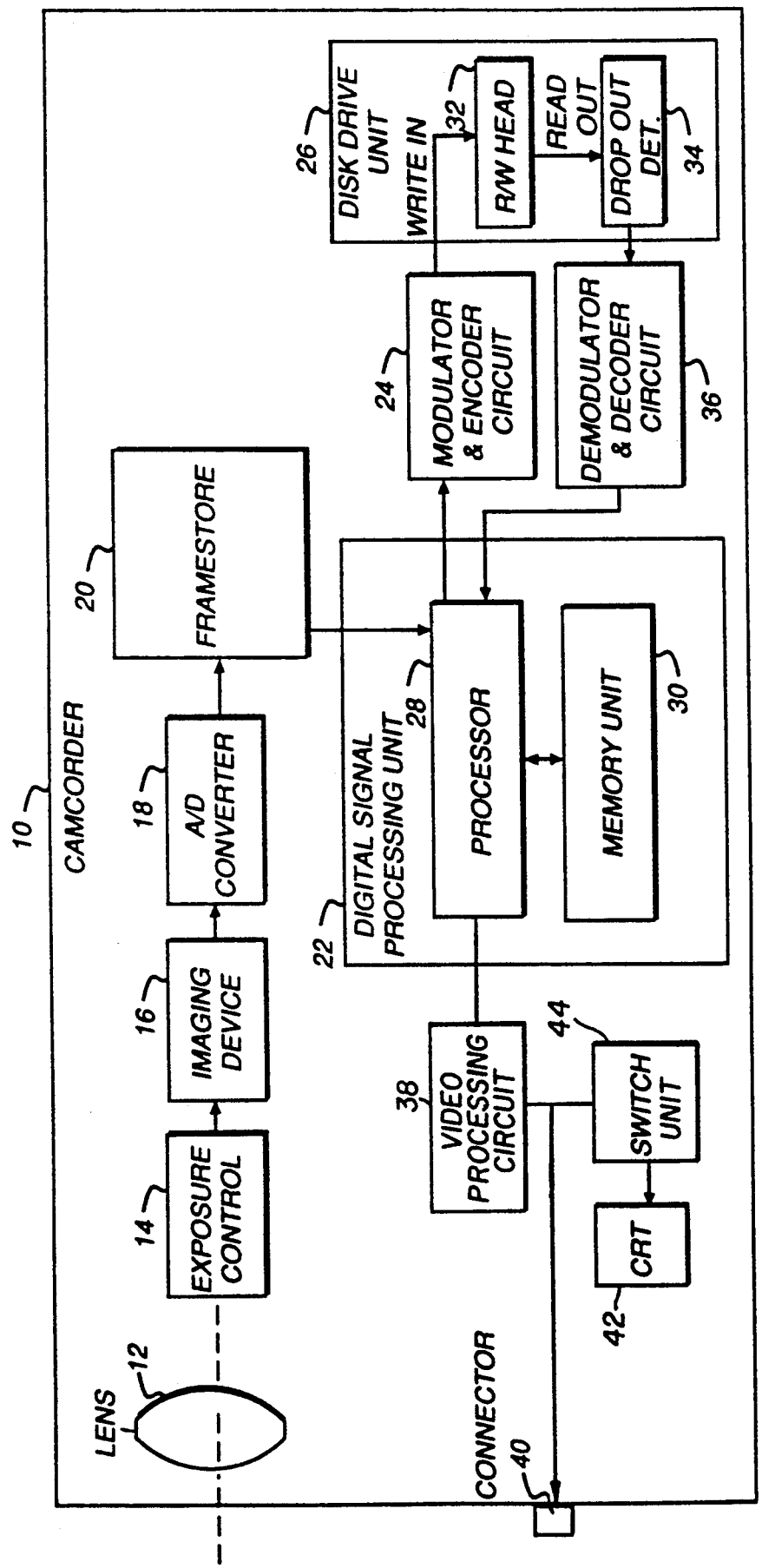

As was discussed above, conventional methods of selecting an appropriate error correction algorithm to perform an error correction routine in digital data processing systems have required a tradeoff between the quality of data produced from the error correction routine and the throughput efficiency of the overall data processing system utilizing the error correction routine. A complex error correction algorithm must be utilized if highly corrupted data recordings are to be processed by the data processing system to reproduce the originally recorded data with a high degree of accuracy. The overall system throughput time is degraded, however, due to the time required to perform the complex error correction algorithm. System throughput efficiency can be increased by utilizing a less complex error correction algorithm, or only a portion of a multilevel error correction algorithm, which requires less time to perform. The use of a less complex error correction algorithm, however, results in a corresponding loss in the quality of the reproduced data. Thus, conventional systems have been forced to compromise and select an error correction algorithm that performs the error correction function satisfactorily in the majority of cases with the least amount of impact on the throughput efficiency of the overall system.

The present invention, in contrast to conventional methods and systems, is based on the recognition that the optimum error correction routine for a given situation can be selected based on a characteristic of the digital data signal to be processed. Specifically, a reproduced data signal is monitored for a particular error characteristic, such as drop out, and an optimum error correction routine is selected based on the monitored error characteristic. For example, a digital data signal reproduced from a highly corrupted recording having a high degree of drop out is processed with a complex error correction algorithm, a data signal with a low degree of drop out is processed with a less complex error correction algorithm, and the error correction routine is bypassed if no errors are detected in the data signal. Thus, the error correction algorithm to be employed is constantly matched to the quality of the digital data signal to be processed, thereby insuring that the error correction routine is optimized for each data signal to be processed while the overall impact to the throughput efficiency of the overall system is minimized.

The invention will now be described in greater detail with reference to FIG. 1, which illustrates a still video floppy (SVF) digital camcorder 10 that includes a lens system 12, an exposure control mechanism 14, such as a shutter and diaphragm assembly, an electronic imaging device 16, an A/D converter 18 coupled to the output of the electronic imaging device 16 and to an input of a framestore 20, a digital signal processing unit 22 coupled to an output of the framestore 20, and a modulator and encoder circuit 24 coupled to an output of the digital signal processing unit 22 and to an input of a disk drive unit 26. The digital signal processing unit 22 preferably contains a single processor 28 which performs error compression, data formatting and parity generation functions during a write operation, and deformatting, error decoding and data decompression during a read operation, in response to a control program that is stored in a memory unit 30 that is coupled to the processor 28. The disk drive unit 26 includes a read/write transducer head 32, either magnetic or optical, coupled to a drop out detector unit 34. The read/write transducer head 32 is used to write information to and retrieve information from a storage disk that is loaded into the disk drive unit 26. The drop out detector unit 34 monitors the output signal from the read/write transducer head 32 and supplies a corresponding drop out detection signal to the digital signal processing unit 22. The output signal from the read/write transducer head 32 is then supplied to a demodulator and decoder circuit 36 that is coupled to the drop out detector 34 of the disk drive unit 26. The demodulator and decoder circuit 36 is coupled to the digital signal processing unit 22, which in turn is coupled to a video processing circuit 38. Digital signal processing unit 22 processes a signal received from the demodulator and decoder circuit 26 and supplies the processed signal to the video processing circuit 38. The output signal from the video processing circuit 38 is supplied to a video output connector 40 of the camcorder. The output signal from the video processing circuit 38 can also be selectively supplied to a CRT viewfinder monitor 42 under the control of a switching unit 44. Overall system control is provided by a microprocessor controller (not shown) which initiates and controls system operation in response to control signal received from an operator control unit (not shown).

The operation of the illustrated camcorder 10 will now be discussed in greater detail. The microprocessor controller, in response to a control signal received from the operator control unit, activates the exposure control mechanism 14 to expose the electronic imaging device 16 to scene light. The electronic imaging device 16, for example a CCD image sensor, includes a plurality of pixel elements that integrate incident scene light and generate a corresponding photocharge in a manner well known in the art. The contents of the pixel elements are clocked from the electronic imaging device 16 through the use of shift registers to form an analog output signal that is applied to the A/D converter 18. The A/D converter 18 converts the analog output signal to digital image data which is stored in the framestore 20. The digital signal processing unit 22 retrieves the digital image data from the framestore 20 and performs the various functions listed above, namely, data formatting, data compression and parity generation. Preferably, data compression is accomplished through the use of a discrete cosine transform function, although other types of well known compression techniques may be readily employed. The resulting compressed data is supplied by the digital data processing unit 22 to the modulator and encoder circuit 24 which modulates and encodes the compressed data before supplying the data to the read/write head 32 of the disk drive unit 26. The read/write head 32 then writes the compressed data to a storage disk (not shown) that is loaded in the disk drive unit 26.

The basic process described above is reversed during a read operation. The read/write head 32 reproduces the compressed data which was previously written on the storage disk and supplies the reproduced data to the demodulator and decoder circuit 36. The output signal from the demodulator and decoder circuit 36 is supplied to the digital signal processing unit 22 which performs deformatting, error decoding and data decompression functions. The output of the digital signal processing unit 22 is then supplied to the video processing circuit 38 which formats the signal received from the digital data processing unit 22 into a standard format video signal. The standard format video signal is supplied to the connector 40 and to the CRT viewfinder 42.

The digital signal processing unit 22 is responsive to the drop out detection signal from the drop out detector 34 to select an optimum error decoding routine for the data signal being processed. More specifically, a plurality of error correction algorithms are loaded in the memory unit 30. The processor 28 of the digital signal processing unit 22 selects one of the error correction algorithms from the memory unit 30 based on the amount of drop out in the signal reproduced by the read/write head 32. The processor 28 selects a complex error correction algorithm for high drop out rates, for example on the order of 0.4 msec, and less complex decoding algorithms for correspondingly lower drop out rates. Alternatively, a single multi-level error correction algorithm (for example Reed-Solomon) is stored in the memory unit 30 and the processor 28 selects the number of levels of the multi-level error correction algorithm to be performed based on the amount of drop out in the reproduced signal. In either case, the error correction routine is optimized based on a characteristic of the reproduced data signal while overall system throughput efficiency is maximized, as the more complex and time consuming algorithms are performed only when absolutely necessary.

The invention has been described with reference to certain preferred embodiments thereof, it will be understood, however, that modifications and variations are possible within the scope of the appended claims. While the invention has been described with particular reference to an electronic camcorder, the invention is not limited to the disclosed application. In fact, the invention is particularly well suited to all applications in which error correction is applied to a received or reproduced data signal. In addition, error characteristics other than drop out rate may be employed to control the selection of the optimum error correction algorithm.

What is claimed is:

1. An electronic imaging apparatus including error correction comprising:

an electronic imaging device that generates image data when exposed to scene light, means for exposing the electronic imaging device to scene light, conversion means for converting the image data generated by the electronic imaging device to digital image data; compression processing means for compressing the digital image data; means for recording the compressed digital image data on a storage disk; reproduction means for reproducing the compressed digital image data from the storage disk; detection means for detecting an error characteristic of the reproduced compressed digital image data and generating a detection signal indicative thereof; error correction means for receiving the reproduced compressed digital image data from the reproduction means and correcting errors in the reproduced compressed digital image data in response to the detection signal generated by the detection means; and decompression processing means for decompressing the reproduced compressed digital image data;

wherein the error correction means includes a memory unit and selects an optimum error correction algorithm from a plurality of error correction algorithms loaded in the memory unit in response to the detection signal and wherein the error correction means applies the optimum error correction algorithm to the reproduced compressed digital image data in order to correct errors contained therein.

2. An electronic imaging apparatus as claimed in claim 1, wherein the detection means includes means for detecting a drop out rate of the digital data signal.

3. An electronic imaging apparatus including error correction comprising:

an electronic imaging device that generates image data when exposed to scene light, means for exposing the electronic imaging device t scene light, conversion means for converting the image data generated by the electronic imaging device to digital image data; compression processing means for compressing the digital image data; means for recording the compressed digital image data on a storage disk; reproduction means for reproducing the compressed digital image data from the storage disk; detection means for detecting an error characteristic of the reproduced compressed digital image data and generating a detection signal indicative thereof; error correction means for receiving the reproduced compressed digital image data from the reproduction means and correcting errors in the reproduced compressed digital image data in response the detection signal generated by the detection means; and decompression processing means for decompressing the reproduced compressed digital image data;

wherein the error correction means implements a multi-level error correction algorithm to correct the errors contained in the reproduced compressed digital image data and selects the number of levels of the multi-level error correction algorithm to be performed in response to the detection signal.

* * * * *